(12) United States Patent
Lee

(10) Patent No.: US 12,316,330 B2
(45) Date of Patent: May 27, 2025

(54) COMPARATOR CIRCUIT WITH DYNAMIC HYSTERESIS

(71) Applicant: Texas Instruments Incorporated, Dallas, TX (US)

(72) Inventor: Ho-Young Lee, San Jose, CA (US)

(73) Assignee: Texas Instruments Incorporated, Dallas, TX (US)

( * ) Notice: Subject to any disclaimer, the term of this patent is extended or adjusted under 35 U.S.C. 154(b) by 61 days.

(21) Appl. No.: 18/175,109

(22) Filed: Feb. 27, 2023

(65) Prior Publication Data

US 2024/0213971 A1    Jun. 27, 2024

Related U.S. Application Data

(60) Provisional application No. 63/434,313, filed on Dec. 21, 2022.

(51) Int. Cl.

| | |
|---|---|
| *H03K 3/00* | (2006.01) |
| *H03K 3/0233* | (2006.01) |
| *H03K 3/3565* | (2006.01) |
| *H03K 5/24* | (2006.01) |

(52) U.S. Cl.
CPC ....... *H03K 5/2481* (2013.01); *H03K 3/02337* (2013.01); *H03K 3/3565* (2013.01)

(58) Field of Classification Search
CPC .... H03K 3/3565; H03K 5/2481; H03K 3/023; H03K 3/02337; H03K 5/22
See application file for complete search history.

(56) References Cited

U.S. PATENT DOCUMENTS

| | | | |
|---|---|---|---|
| 4,797,631 A | 1/1989 | Hsu et al. | |
| 5,808,496 A | 9/1998 | Thiel | |
| 6,087,873 A * | 7/2000 | Alexander | ........... H03K 3/0377 |
| | | | 327/206 |

(Continued)

OTHER PUBLICATIONS

Furth et al., "On the design of low-power CMOS comparators with programmable hysteresis," 2010 53rd IEEE International Midwest Symposium on Circuits and Systems (IEEE, 2010), pp. 1077-1080.

(Continued)

*Primary Examiner* — Tuan T Lam
(74) *Attorney, Agent, or Firm* — John R. Pessetto; Frank D. Cimino

(57) ABSTRACT

A comparator circuit with dynamic hysteresis. A common source branch is configured to conduct a differential current at first and second intermediate outputs responsive to a differential input at first and second inputs, and a common gate branch is configured to generate a voltage at a third intermediate output responsive to the differential current at the first and second intermediate outputs. A hysteresis branch includes a hysteresis current generator including first and second replica transistors having source/drain paths coupled in parallel, and gates coupled to the first and second inputs, respectively. A hysteresis capacitor is coupled between the sources of the first and second replica transistors and the common terminal. Current mirror circuitry is coupled to the source/drain paths of the first and second replica transistors, to supply a hysteresis current responsive to the absence of current conducted by the parallel first and second replica transistors.

20 Claims, 7 Drawing Sheets

(56) References Cited

U.S. PATENT DOCUMENTS

| | | | | |
|---|---|---|---|---|
| 6,229,350 B1* | 5/2001 | Ricon-Mora | ........ | H03K 3/3565 |
| | | | | 363/41 |
| 7,187,223 B2* | 3/2007 | Yeo | ...................... | H03K 5/2481 |
| | | | | 327/205 |
| 8,310,279 B2* | 11/2012 | Sudjian | ................ | H03K 5/2481 |
| | | | | 327/205 |
| 8,901,980 B1* | 12/2014 | Naish | ................... | H03K 3/3565 |
| | | | | 327/205 |
| 9,654,091 B2* | 5/2017 | Wu | ........................ | H03K 5/082 |
| 10,418,952 B1* | 9/2019 | Abhishek | .............. | H03F 1/0216 |
| 10,594,285 B1* | 3/2020 | Delshadpour | ....... | H04L 25/0294 |
| 10,985,706 B1* | 4/2021 | Li | ....................... | H03F 3/45233 |
| 11,405,030 B1 | 8/2022 | Mustafi et al. | | |
| 2009/0027086 A1* | 1/2009 | Trifonov | .............. | H03K 3/3565 |
| | | | | 327/66 |
| 2013/0120046 A1* | 5/2013 | Prohaska | ........... | H03K 3/02337 |
| | | | | 327/206 |
| 2020/0014376 A1 | 1/2020 | Joly et al. | | |

OTHER PUBLICATIONS

"TLV3604, TLV3605 800-ps High-Speed RRI Comparator with LVDS Outputs," Datasheet SNASDA2D (Texas Instruments Incorporated, Jul. 2021).

* cited by examiner

COMPARATOR CIRCUIT WITH DYNAMIC HYSTERESIS

CROSS-REFERENCE TO RELATED APPLICATIONS

This application claims priority, under 35 U.S.C. § 119(e), to U.S. Provisional Application No. 63/434,313, filed Dec. 21, 2022, said application incorporated herein by reference in its entirety.

STATEMENT REGARDING FEDERALLY SPONSORED RESEARCH OR DEVELOPMENT

Not applicable.

BACKGROUND OF THE INVENTION

This relates to comparator circuits.

Comparator circuits are constructed and operable to compare two analog input voltages with one another, and to output a digital signal level indicating the result of that comparison. As such, the comparator is a hybrid circuit operating in both the analog and digital domains, in that it receives and compares analog inputs to provide a digital output. The digital output signal from the comparator may be used by digital circuitry downstream from the comparator, for example in making operational or control decisions in the end system. For one example, one input to a comparator may receive an output from a sensor or other measuring device in a vehicle or other system, with the other input receiving a reference voltage corresponding to a threshold limit or decision criterion. In this example, the comparator may respond to the sensor output voltage increasing to a voltage higher than the reference voltage by generating a logic level transition at its output. In response to this output signal from the comparator, downstream digital circuitry may issue an alert or cause another action according to the detected condition.

Comparator circuits can be vulnerable to spurious switching in the event that the input differential is of low amplitude (e.g., the voltages at the two inputs are close to one another). In this situation, non-idealities such as noise at the comparator inputs and device mismatch within the comparator circuit itself can cause undesired transitions at the digital output. Conventional comparator circuits address this vulnerability by adding hysteresis to the comparator's transfer characteristic. Conventional comparator circuits often use a small static hysteresis current to modulate the switching threshold of the comparator so as to resist transition to the opposite state. Stated differently, the hysteresis current causes the switching threshold for a positive polarity differential input signal to differ from the switching threshold for a differential input signal of negative polarity.

By way of further background, the TLV3604 high-speed comparator available from Texas Instruments Incorporated incorporates a differential pair of transistors in an input stage, followed by a gain stage. This comparator includes a circuit that applies a hysteresis current at the output of the input stage in response to the summed current from both of the input differential transistors being below a threshold level.

It is within this context that the embodiments described herein arise.

BRIEF SUMMARY OF THE INVENTION

According to one aspect, a comparator circuit includes a common source branch, a common gate branch, and a hysteresis branch. The common source branch includes first and second transistors having their sources coupled in common, their gates coupled to first and second inputs of the comparator circuit, respectively, and their drains coupled to second and first intermediate outputs, respectively. The common gate branch includes third and fourth transistors having gates coupled in common to a first bias voltage, the third transistor having a source coupled to the first intermediate output and to a common terminal and a drain coupled to a third intermediate output, and the fourth transistor having a source coupled to the second intermediate output and the common terminal, and having a drain coupled to a bias circuit. A digital output circuit has an input coupled to the third intermediate output, and is configured to output complementary logic levels at first and second outputs responsive to a voltage at its input. The hysteresis branch includes a hysteresis current generator, and first and second hysteresis transistors having source-drain paths coupled between an output of the hysteresis current generator and the second and first intermediate outputs, respectively, and having gates coupled to the complementary outputs of the digital output circuit. The hysteresis current generator includes first and second replica transistors having sources coupled in common to a second current source, and having drains coupled in common, the first replica transistor having a gate coupled to the first input, and the second replica transistor having a gate coupled to the second input, a hysteresis capacitor coupled between the sources of the first and second replica transistors and the common terminal. A first current mirror has a first leg coupled to the drains of the first and second replica transistors, and a second leg coupled to a second current source, at which a first leg of a second current mirror is coupled. The second current mirror has a second leg coupled to an output transistor.

According to another aspect, a comparator circuit includes a common source branch, a common gate branch, and a hysteresis branch. The common source branch includes first and second transistors having their sources coupled in common, their gates coupled to first and second inputs of the comparator circuit, respectively, and their drains coupled to second and first intermediate outputs, respectively. The common gate branch includes third and fourth transistors having gates coupled in common to a first bias voltage, the third transistor having a source coupled to the first intermediate output and to a common terminal and a drain coupled to a third intermediate output, and the fourth transistor having a source coupled to the second intermediate output and the common terminal, and having a drain coupled to a bias circuit. A digital output circuit has an input coupled to the third intermediate output, and is configured to output complementary logic levels at first and second outputs responsive to a voltage at its input. The hysteresis branch includes a hysteresis current generator, and first and second hysteresis transistors having source-drain paths coupled between an output of the hysteresis current generator and the second and first intermediate outputs, respectively, and having gates coupled to the complementary outputs of the digital output circuit. The hysteresis current generator includes first and second coupling capacitors coupled to the first and second inputs. A current mirror includes a first leg transistor coupled between a supply terminal and a first current source, and a gate coupled to its drain, and a second leg transistor coupled between a supply terminal and the first and second hysteresis transistors. A gate of the second leg transistor is coupled to the gate of the first leg transistor via a resistor, and is also coupled to the first and second coupling capacitors.

According to another aspect, a comparator circuit includes a common source branch configured to conduct a differential current at first and second intermediate outputs responsive to a differential input at first and second inputs, a common gate branch configured to generate a voltage at a third intermediate output responsive to the differential current at the first and second intermediate outputs, a digital output circuit having an input coupled to the third intermediate output, and configured to present complementary logic levels at first and second outputs responsive to a voltage at its input, and a hysteresis branch. The hysteresis branch includes a hysteresis current generator including first and second replica transistors having source/drain paths coupled in parallel, the first replica transistor having a gate coupled to the first input, and the second replica transistor having a gate coupled to the second input, a hysteresis capacitor coupled between the sources of the first and second replica transistors and the common terminal, and current mirror circuitry, coupled to the source/drain paths of the first and second replica transistors, and configured to supply a current at an output of the hysteresis current generator inversely related to current conducted by the parallel first and second replica transistors. First and second hysteresis transistors are coupled between the output of the hysteresis current generator and the second and first intermediate outputs, respectively, and have gates coupled to the first and second outputs of the digital output circuit, respectively.

Technical advantages enabled by one or more of these aspects include dynamic hysteresis in comparator circuits to prevent spurious and erroneous output transitions that may be caused by transient events of various types at the comparator inputs. Examples of these transient events include a current "deadzone" of zero differential current from the comparator input stage, and also a current spike event caused by an abrupt transition at an input.

Other technical advantages enabled by the disclosed aspects will be apparent to those of ordinary skill in the art having reference to the following specification together with its drawings.

BRIEF DESCRIPTION OF THE SEVERAL VIEWS OF THE DRAWING

The same reference numbers or other reference designators are used in the drawings to illustrate the same or similar (in function and/or structure) features.

DETAILED DESCRIPTION OF THE INVENTION

The one or more embodiments described in this specification are implemented into a comparator circuit suitable for high voltage system applications such as automotive systems, as it is contemplated that such implementation is particularly advantageous in that context. However, it is also contemplated that aspects of these embodiments may be beneficially applied in other system applications beyond the automotive context, and also as suitable for lower voltage system applications. Accordingly, it is to be understood that the following description is provided by way of example only, and is not intended to limit the true scope of this invention as claimed.

Figure 1A:
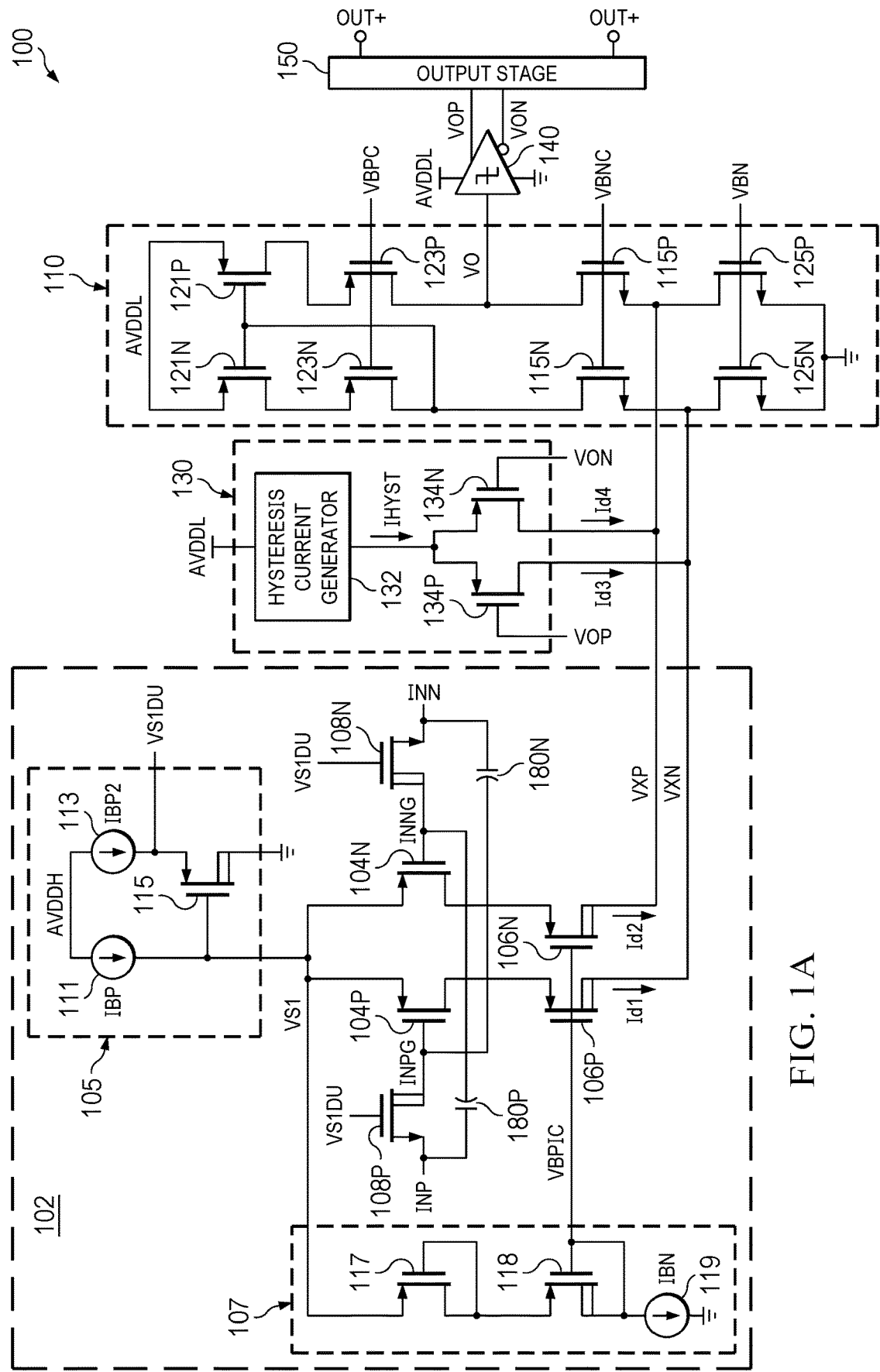
FIG. 1A is an electrical diagram, in schematic form, of a comparator circuit according to example embodiments.

FIG. 1A illustrates the construction of comparator 100 constructed and operable for implementation in a high voltage environment, such as an automotive system, according to an example embodiment. In this example, comparator 100 is constructed using metal-oxide-semiconductor (MOS) transistors arranged in a folded cascode arrangement, including a common source branch 102 and a common gate branch 110. Common source branch 102 serves as the input stage of comparator 100, and receives differential inputs INP and INN.

In this high voltage example, common source branch 102 includes a differential input stage including p-channel MOS (PMOS) transistors 104P and 104N. Input INP is coupled to the gate of PMOS transistor 104P via high-voltage n-channel MOS (NMOS) transistor 108P and input INN is coupled to the gate of PMOS transistor 104N via high-voltage NMOS transistor 108N. High-voltage transistors 108P, 108N may be constructed as drain-extended MOS (DEMOS) devices, or according to other conventional techniques suitable for withstanding higher drain-to-source voltages (e.g., 40V) than may be tolerable for lower voltage transistors such as transistors 104P, 104N (e.g., 5V). The sources of PMOS transistors 104P, 104N are connected in common, and receive a common source voltage VS1 established by bias circuit 105 from a power supply voltage at supply terminal AVDDH.

Bias circuit 105 in this example includes current source 111 configured to conduct a substantially constant current IBP from supply terminal AVDDH to the sources of PMOS transistors 104P, 104N. Bias circuit 105 also includes current source 113 configured to conduct current IBP2 from supply terminal AVDDH to the source of high-voltage PMOS transistor 115. Transistor 115 has its drain at a common terminal (e.g., circuit ground), and a gate coupled to the common sources of PMOS transistors 104P, 104N. The source of PMOS transistor 115 in bias circuit 105, at which voltage VS1DU is established, is coupled to the gates of high-voltage transistors 108P, 108N.

The drain of PMOS transistor 104P is coupled to the source of high-voltage PMOS transistor 106P, and the drain of PMOS transistor 104N is coupled to the source of high-voltage PMOS transistor 106N. PMOS transistors 106P, 106N receive a gate voltage VBPIC established by bias circuit 107. Bias circuit 107 in this example includes PMOS transistor 117 with its source coupled to the sources of PMOS transistors 104P, 104N and thus receiving common source voltage VS1. PMOS transistor 117 may be constructed as a low-voltage transistor (e.g., as a logic transistor) to substantially match the construction of PMOS transistors 104P, 104N. PMOS transistor 117 has its gate and drain of PMOS transistor 117 connected together and coupled to the source of high-voltage PMOS transistor 118. PMOS transistor 118 may be constructed to substantially match high-voltage PMOS transistors 106P, 106N (e.g., as a DEMOS transistor), and has its gate and drain coupled through current source 119 (conducting a current IBN) to the common terminal. Voltage VBPIC is established by bias circuit 107 at the gate and drain of transistor 118.

The drain of high-voltage PMOS transistor 106P is coupled to intermediate output line VXN, and the drain of high-voltage PMOS transistor 106N is coupled to intermediate output line VXP. Intermediate output line VXP is coupled to the source of NMOS transistor 115P in common gate branch 110, and intermediate output line VXN is coupled to the source of NMOS transistor 115N in common gate branch 110. The gates of transistors 115N, 115P are connected in common to receive a bias voltage VBNC.

Common gate branch 110 includes a current mirror bias circuit that includes PMOS transistors 121N, 121P and common gate PMOS transistors 123N, 123P. PMOS transistors 121N and 121P have their sources coupled in common to supply terminal AVDDL. The drain of PMOS transistor 121N is coupled to the source of PMOS transistor 123N, and the drain of PMOS transistor 123N is coupled to the drain of NMOS transistor 115N. The node at the drains of NMOS transistor 115N and PMOS transistor 123N is coupled to the commonly-connected gates of PMOS transistors 121P, 121N. Similarly, the drain of PMOS transistor 121P is coupled to the source of PMOS transistor 123P, and the drain of PMOS transistor 123P is coupled to the drain of NMOS transistor 115P at intermediate output node VO. The gates of PMOS transistors 123P and 123N are connected in common to receive a bias voltage VBPC. The source of NMOS transistor 115N, at intermediate output line VXN, is coupled to the drain of NMOS transistor 125N, which has its source at the common potential (e.g., circuit ground). Similarly, the source of NMOS transistor 115P, at intermediate output line VXP, is coupled to the drain of NMOS transistor 125P, which also has its source at circuit ground. The gates of transistors 125N, 125P are connected in common to receive a bias voltage VBN.

In this implementation, the supply terminal AVDDH powering common source branch 102 may be separate and isolated from supply terminal AVDDL powering common gate branch 110, such that the two branches may receive different power supply voltages. In this example in which common source branch 102 includes high-voltage transistors (e.g., transistors 106P, 106N, 108P, 108N), the power supply voltage applied to supply terminal AVDDH (e.g., on the order of 10V) may be higher than that applied to supply terminal AVDDL (e.g., on the order of 5V). The higher power supply voltage applied to terminal AVDDH can be more conducive to higher input voltages that may be applied to inputs INP, INN, such as may be encountered in automotive and other high voltage system applications.

In such a high-voltage implementation, transistors 108P, 108N serve to protect the gates of input transistors 104P, 104N from high voltages at the inputs INP, INN. Transistors 106P, 106N similarly serve to protect transistors in common gate branch 110 from high voltages that may be present in common source branch 102.

Intermediate output VO from common gate branch 110 is coupled to an input of Schmitt trigger 140. Schmitt trigger 140, which is powered from supply terminal AVDDL, has outputs VOP, VON that drive complementary digital logic levels in response to the voltage established by common gate branch 110 at intermediate output VO. In this example, outputs VOP, VON of Schmitt trigger 140 are coupled to inputs of digital output stage 150, which has digital outputs OUT+, OUT− operating at the desired signal levels (e.g., 40V high-voltage digital output levels, or 5V low-voltage digital output levels). Outputs OUT+, OUT− may be coupled to downstream circuitry, such as controller or other decision circuitry, with the particular downstream circuitry selected according to the system application.

As evident from the above description and from FIG. 1A, certain transistors in comparator 100 receive bias or reference voltages. For example, in common gate branch 110, transistors 115P, 115N receive bias reference voltage VBNC at their gates, transistors 123P, 123N receive bias reference voltage VBPC at their gates, and transistors 125P, 115N receive bias reference voltage VBN at their gates. Similarly, comparator 100 includes various current sources, such as current sources 111, 113, and 119 in common source branch 102. Such current sources are commonly controlled by a reference voltage or other analog level to conduct the indicated current levels to be stable or otherwise regulated. Comparator 100 in this example thus includes bandgap reference circuits or other reference circuits that are not shown in FIG. 1A, such circuits constructed according to conventional techniques for generating these regulated or otherwise stable bias voltages and currents at levels appropriate for proper circuit operation.

In operation, current IBP from current source 111 in bias circuit 105 establishes a voltage at the common source node VS1. The voltage at node VS1 biases the gate of transistor 115 in bias circuit 105 to establish a voltage VS1DU that is applied to the gates of high-voltage transistors 108P, 108N, turning on those devices so that the voltages at inputs INP, INN are coupled as gate voltages INPG, INNG at the gates of common source input transistors 104P, 104N, respectively. A differential voltage at inputs INP, INN, which couples to the gates of transistors 104P, 104N as a differential voltage between gate voltages INPG, INNG, causes current IBP to be unevenly split between transistors 104P, 104N. High-voltage transistors 106P, 106N are turned on by common gate voltage VBPIC from bias circuit 107, and conduct the respective currents Id1, Id2 from transistors 104P, 104N to intermediate output lines VXN, VXP, respectively. In response to a differential input voltage, therefore, common source branch 102 thus generates a differential current between drain current Id1 into intermediate output line VXN and drain current Id2 from PMOS transistor 106P into intermediate output line VXP. In response to this differential current Id1-Id2, common gate branch 110 establishes a logic level at its intermediate output VO.

For example, if input INP is at a higher voltage than input INN, transistor 104N will be turned on harder than transistor 104P, and will thus conduct a majority of current IBP. In this case, current Id2 conducted to intermediate output line VXP will be larger than current Id1 conducted to intermediate output line VXN. This differential current causes common gate branch 110 to drive the voltage at intermediate output VO toward AVDDL. As this higher voltage at intermediate output VO exceeds the trip voltage of Schmitt trigger 140, Schmitt trigger 140 drives a high logic level at its output VOP and a low logic level at its complementary output VON. In response, output stage 150 drives its outputs OUT+, OUT− accordingly.

Conversely, an input differential voltage of the opposite polarity (input INN higher than input INP), results in current Id1 from common source branch 102 being larger than current Id2. In this event, common gate branch 110 pulls intermediate output VO toward circuit ground (e.g., below the trip voltage of Schmitt trigger 140), causing Schmitt trigger 140 to drive a low logic level at its output VOP and a high logic level at complementary output VON. Output stage 150 drives its outputs OUT+, OUT− accordingly.

As shown in FIG. 1A, comparator 100 further includes hysteresis branch 130. Hysteresis branch 130 includes hysteresis current generator 132, which is constructed and operable to dynamically generate a hysteresis current IHYST from the power supply voltage at supply terminal AVDDL as will be described in further detail below. PMOS transistors 134P and 134N have their source nodes connected in common to the output of hysteresis current generator 132. The drain of PMOS transistor 134P is coupled to intermediate output line VXN, and the drain of PMOS transistor 134N is coupled to intermediate output line VXP. PMOS transistor 134P has its gate coupled to output VOP of Schmitt trigger 140, and PMOS transistor 134N has its gate coupled to output VON of Schmitt trigger 140.

In operation, transistors 134P and 134N split hysteresis current IHYST into currents Id3, Id4, respectively, according to the current state of comparator 100. In a general sense, hysteresis branch 130 operates to oppose transitions from the current comparator state. For example, if Schmitt trigger 140 is currently driving its output VOP to a high logic level and its output VON to a low logic level, transistor 134N will be turned on harder than transistor 134P, such that current Id4 conducted to intermediate output line VXP is larger than current Id3 conducted to intermediate output line VXN. The opposite output data state will similarly cause current Id3 to be larger than current Id4. Accordingly, the amplitude of current Id1 or Id2, as the case may be, output by common source branch 102 that is necessary to cause a transition of comparator 100 to the opposite state is increased by an amount corresponding to hysteresis current IHYST from hysteresis current generator 132.

Figure 1B:
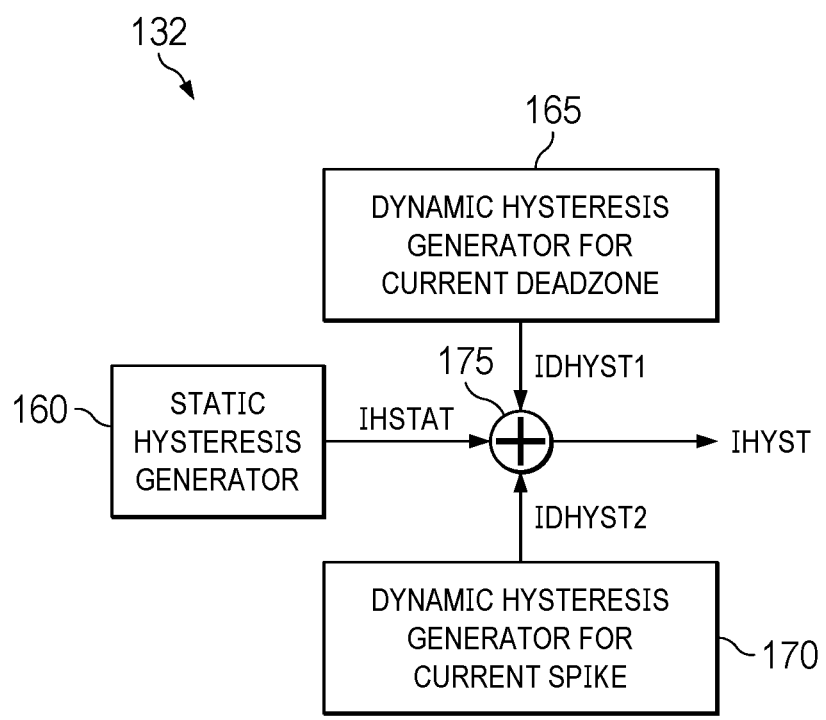
FIG. 1B is an electrical diagram, in block form, of a hysteresis current generator in the comparator circuit of FIG. 1A according to example embodiments.

According to example embodiments, hysteresis current generator 132 is constructed and operable to dynamically apply additional hysteresis current IHYST during operational conditions and events in which comparator 100 may generate spurious transitions. FIG. 1B illustrates the generalized architecture of hysteresis current generator 132 according to one example implementation in which multiple circuits are provided to each generate a component of hysteresis current IHYST. In this example, one such circuit in hysteresis current generator 132 is static hysteresis generator circuit 160, which generates static hysteresis current component IHSTAT. An example of static hysteresis generator circuit 160 suitable for implementation in example embodiments is described in commonly assigned U.S. Pat. No. 5,808,496, incorporated herein by reference. In some implementations, static hysteresis generator circuit 160 may be configured to adjust the level of static hysteresis current component IHSTAT, for example in response to a control signal or reference level. In conventional comparator circuits, the applied static hysteresis current component generally has a relatively low amplitude, so that the hysteresis does not unduly slow the response of the comparator.

Hysteresis current generator 132 further includes, according to this example implementation, dynamic hysteresis current generator 165, which in this example is configured and operable to dynamically generate hysteresis current component IDHYST1 during certain operational events or conditions, specifically during a current "deadzone" in which the differential between currents Id1, Id2 from common source branch 102 is minimal. Hysteresis current generator 132 in this example further includes dynamic hysteresis current generator 170, which in this example is configured and operable to dynamically generate hysteresis current component IDHYST2 during certain operational events or conditions in which a current "spike" is present in either of currents Id1, Id2 from common source branch 102. Adder 175 in hysteresis current generator 132 in this example sums the hysteresis current components IHSTAT, IDHYST1, IDHYST2 to provide hysteresis current IHYST to transistors 134P, 134N in hysteresis branch 130. In this implementation, adder 175 may be constructed merely as a connection or node at which the outputs of static hysteresis current generator 160 and dynamic hysteresis current generators 165, 170 are connected, particularly if the outputs of the dynamic hysteresis current generators 165, 170 present a high impedance state when not sourcing current.

Alternatively, some implementations of comparator 100 according to example embodiments may include dynamic hysteresis current generator 165 but not dynamic hysteresis current generator 170, or may include dynamic hysteresis current generator 170 but not dynamic hysteresis current generator 165, depending on the particular system application. However, providing both dynamic hysteresis current generator 165 and dynamic hysteresis current generator 170 in hysteresis current generator 132, as shown in the example of FIG. 1B, is contemplated to best eliminate spurious transitions at comparator 100 according to these example embodiments.

Figure 2A:
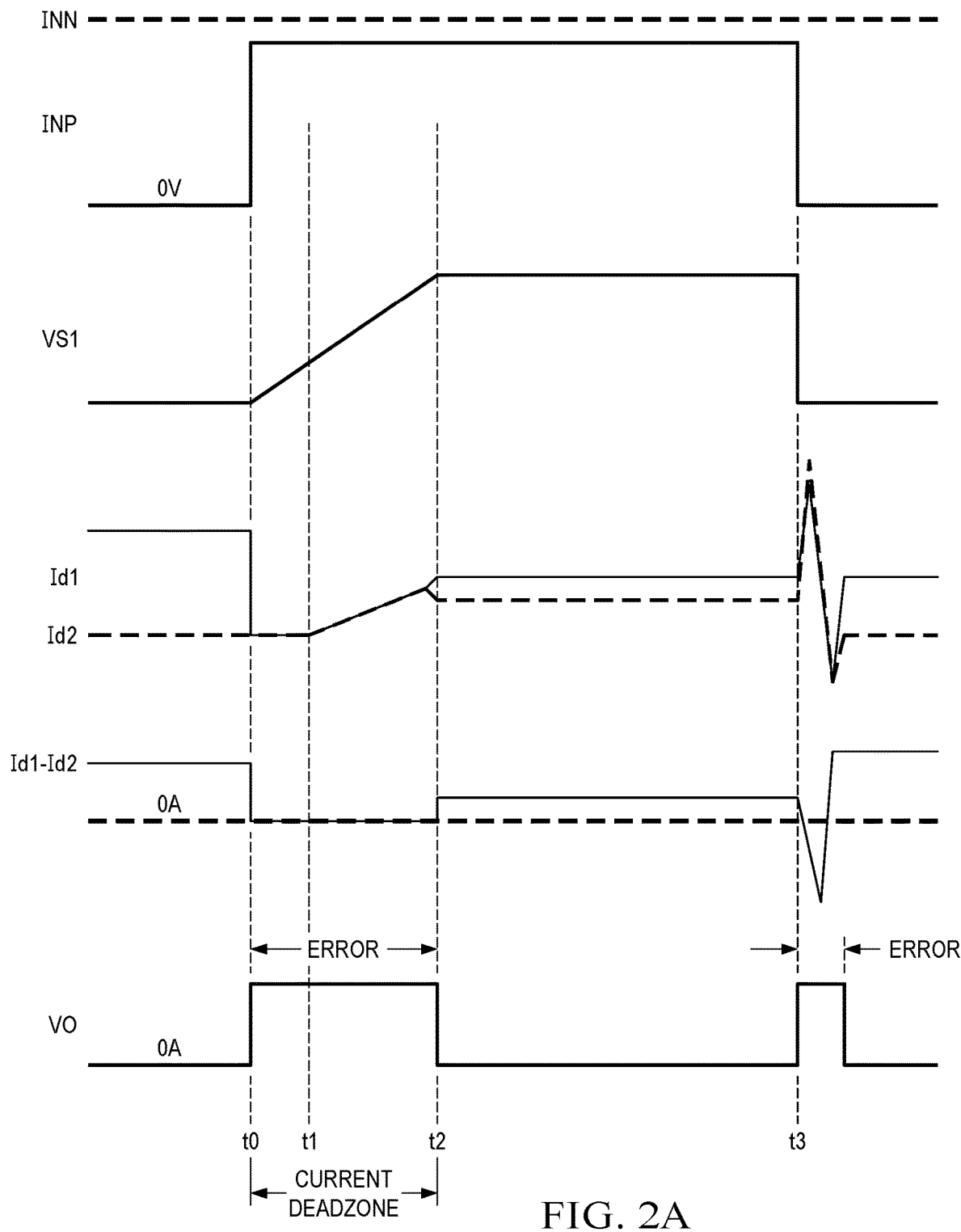
FIG. 2A is a timing diagram illustrating the operation of a conventional folded cascode comparator resulting in spurious output transitions.

As noted above, dynamic hysteresis current generator 165 generates hysteresis current component IDHYST1 during certain operational events or conditions, specifically during a current "deadzone" in which the differential between currents Id1, Id2 from common source branch 102 is minimal. FIG. 2A illustrates an example of such a current "deadzone," as addressed by comparator 100 according to the implementation of FIGS. 1A and 1B.

Prior to time t0 in the example of FIG. 2A, differential input INN is at a high voltage (e.g., 10V in a high voltage implementation) and differential input INP is at a low voltage (e.g., 0V). Common source voltage VS1 is at a low level prior to time t0, as a result of a relatively high Id1 current level (e.g., at about the level of current IBP from current source 111) conducted by PMOS input transistor 104P in response to input INP at 0V. Current Id2 conducted by input transistor 104N is essentially zero at this time, and thus the differential current Id1-Id2 has a positive polarity. Intermediate output VO from common gate branch 110 is at a low logic level at this time.

At time t0 in this operational example, a high voltage slightly below the voltage at input INN (e.g., 0.1V below INN) is abruptly applied to input INP. This high voltage turns off PMOS input transistor 104P, reducing current Id1 essentially to zero, which in turn reduces the differential current Id1-Id2 to zero. Following the transition at time t0, common source voltage VS1 ramps up at a finite rate, due to the finite loop bandwidth of NMOS transistors 108P, 108N. The currents Id1, Id2 conducted by input transistors 104P, 104N also ramp up together with common source voltage VS1, once sufficient gate-to-source voltage has developed (beginning at time t1). However, during the time interval immediately following the transition at time t0 and continuing as the inputs ramp up after time t1, the differential current Id1-Id2 of the input pair remains essentially at zero. During this current "deadzone" between the transition at time t0 and the eventual establishment of a non-zero differential current Id1-Id2 at time t2, device mismatch (e.g., in common gate branch 110) can cause an undesired transition to an incorrect output state ERROR, shown in the example of FIG. 2A by intermediate output VO at a high logic level.

Figure 3A:
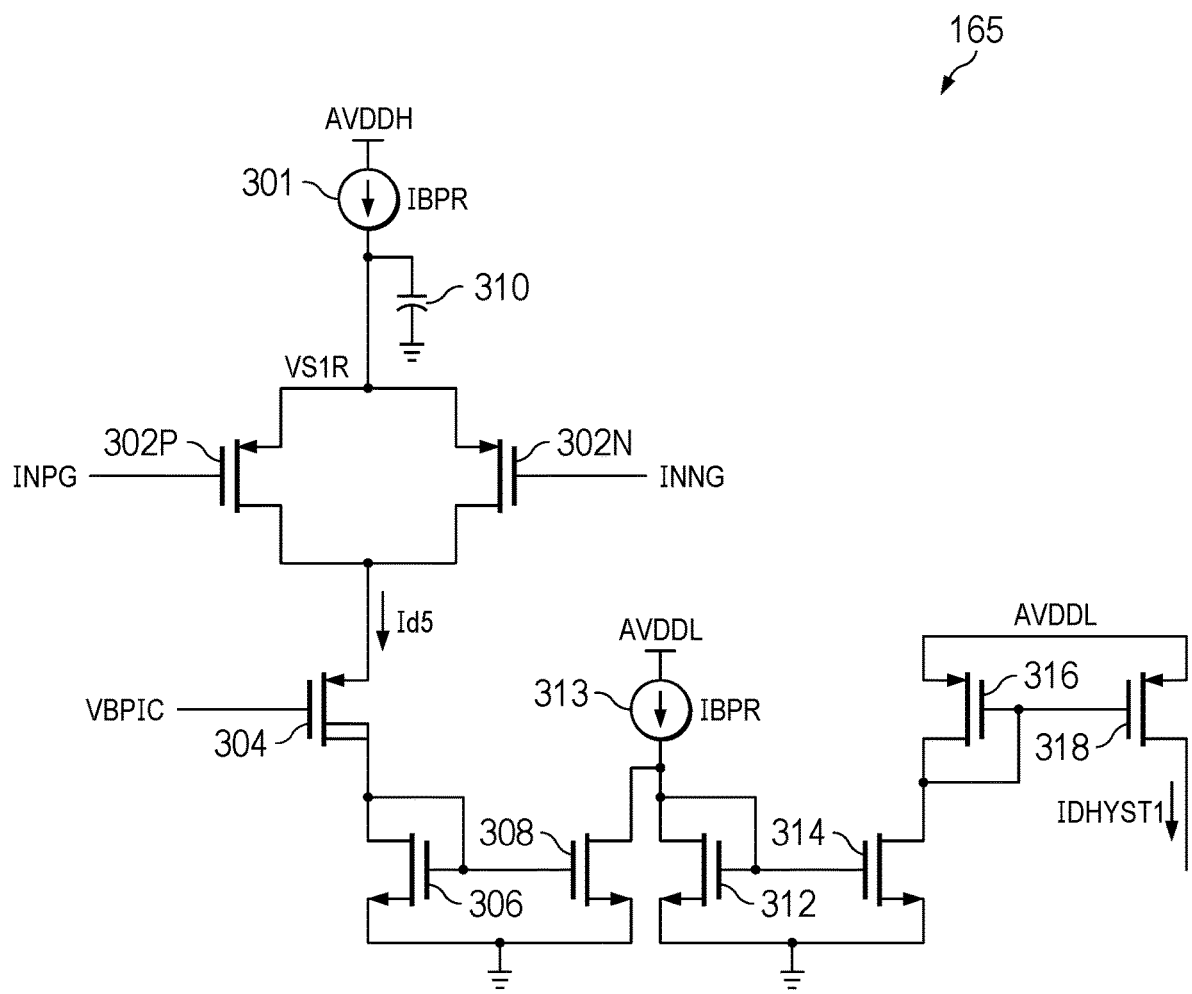
FIG. 3A is an electrical diagram, in schematic form, of a dynamic hysteresis current generator according to an example embodiment.

It has been observed that the amplitude of the static hysteresis current (e.g., as generated by static hysteresis current generator 160 of FIG. 1B) applied in conventional comparators is generally too low to prevent spurious output transitions in "deadzone" situations, especially in high voltage systems such as automotive applications. According to this example embodiment, dynamic hysteresis current generator 165 dynamically generates an additional hysteresis current IHYST1 during such current "deadzones", for example at an amplitude larger than the static hysteresis current, to prevent spurious transitions in deadzone situations. FIG. 3A illustrates the construction of dynamic hysteresis current generator 165 according to an example implementation.

In this implementation, dynamic hysteresis current generator 165 includes replica PMOS transistors 302P, 302N, constructed as replicas of the same or a smaller size of input PMOS transistors 104P, 104N in common source branch 102 of comparator 100. Replica PMOS transistors 302P, 302N are intended to mimic the current "deadzone" exhibited by transistors 104P, 104N. Replica PMOS transistors 302P, 302N have their sources coupled in common. Current source 301 conducts current IBPR from supply terminal AVDDH to the common sources of replica transistors 302P, 302N to establish common source voltage VS1R. Current IBPR serves as a replica current relative to current IBP (e.g., scaled according to the size relationship of replica transistors 302P, 302N) in common source branch 102. Capacitor 310 is coupled between the output of current source 301 and the common terminal (e.g., circuit ground). The drains of replica transistors 302P, 302N are coupled together to the source of high voltage transistor 304. The gate of replica transistor 302P is coupled to input node INPG in common source branch 102, and the gate of replica transistor 302N is similarly coupled to input node INNG. High voltage transistor 304 has its gate coupled to receive a bias reference voltage VBPIC, and has its drain coupled to the drain and gate of NMOS transistor 306, which has its source at the common terminal (e.g., circuit ground).

NMOS transistor 306 is in a current mirror arrangement with NMOS transistor 308, which has its gate coupled to the gate and drain of transistor 306 and its source at circuit ground. The drain of NMOS transistor 308 is coupled to current source 313, which conducts replica current IBPR (e.g., corresponding to current IBPR of current source 301) from supply terminal AVDDL. A second current mirror arrangement includes NMOS transistor 312 with its gate and drain coupled to current source 313 and its source at circuit ground. Replica current IBPR from current source 313 is split between NMOS transistor 312 and NMOS transistor 308. NMOS transistor 314 is mirrored with NMOS transistor 312, and as such has its gate coupled to the gate and drain of transistor 312 and its source at circuit ground. The drain of NMOS transistor 314 is coupled to the drain and gate of PMOS transistor 316 in a third current mirror arrangement; the source of PMOS transistor 316 is coupled to supply terminal AVDDL. PMOS transistor 318 has its source at supply terminal AVDDL and its gate coupled to the gate and drain of PMOS transistor 316 in this third current mirror.

The drain of PMOS transistor 318 serves as the output of dynamic hysteresis current generator 165, and sources hysteresis current component IDHYST1 (to adder 175 in FIG. 1B).

Figure 3B:
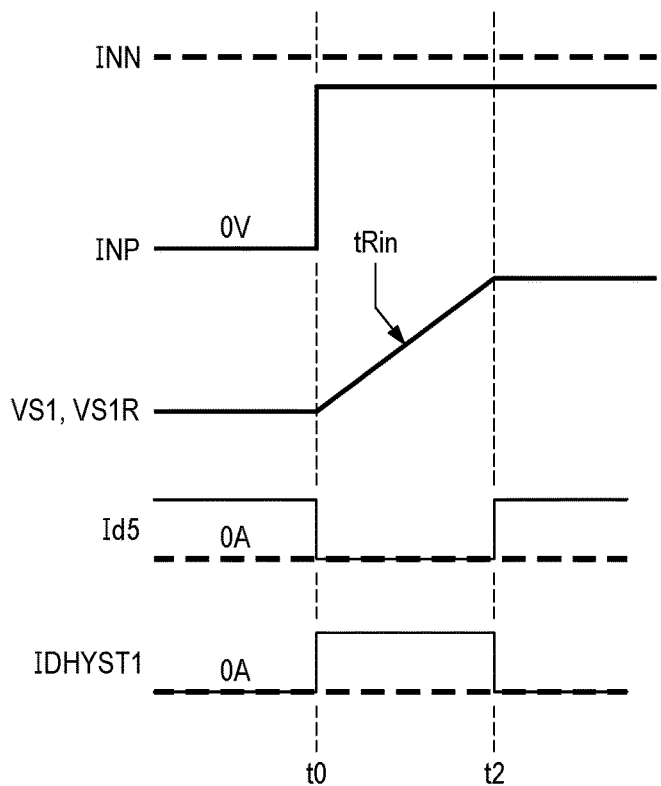
FIG. 3B is a timing diagram illustrating an example of the operation of the dynamic hysteresis current generator of FIG. 3A according to an example embodiment.

FIG. 3B illustrates the operation of dynamic hysteresis current generator 165 in hysteresis branch 130 in preventing spurious output transitions during current "deadzone" situations. As described above relative to FIG. 2A, a current "deadzone" can be initiated by the rapid transition of the one of the comparator inputs (e.g., INP), previously at a lower voltage, to a high voltage close to that at the other comparator input (e.g., INN), for example as shown at time t0 in FIG. 3B. Transistors 302P, 302N in dynamic hysteresis current generator 165, constructed as replicas of transistors 102P, 102N in common source branch 102, serve to mimic the current "deadzone" behavior of common source branch 102, such that common source voltage VS1R ramps up at substantially the same time and at substantially the same rate as common source voltage VS1 in common source branch 102. During this ramping interval from time t0 to time t2 in FIG. 3B, however, capacitor 310 is absorbing the bias current IBPR from current source 301, which maintains the voltage at replica source node VS1R below the gate voltages of transistors 302P, 302N. As a result, substantially zero current Id5 is conducted from the common drain node of replica transistors 302P, 302N over the interval between time t0 and time t2 in FIG. 3B, during such time as replica transistors 302P, 302N are in an off state due to the low voltage at common source node VS1R.

Because no current Id5 is conducted through transistor 306 during this "deadzone" interval, mirror transistor 308 similarly conducts no current during this time. As such, substantially all of current IBPR from current source 313 is conducted by NMOS transistor 312 in the second current mirror of dynamic hysteresis current generator 165. This current conducted by transistor 312 is mirrored as a corresponding current conducted by transistors 314 and 316. The current conducted by transistor 316 is in turn conducted by transistor 318, resulting in hysteresis current component IDHYST1 being output from the drain of transistor 318 in the "deadzone" interval during which current Id5 is substantially zero. Hysteresis current component IDHYST1 is added to static hysteresis component IHSTAT by adder 175, and applied by one of transistors 134P, 134N (depending on the current output state) as current Id3 or Id4, to maintain the previous output state of comparator 100 through this current "deadzone" interval.

Upon common source voltage VS1 and thus replica common source voltage VS1R reaching its eventual level at time t2, current IBPR from current source 301 is no longer absorbed by capacitor 310, but is instead conducted by replica transistors 302P, 302N according to the differential voltage at input nodes INPG, INNG. Current Id5 conducted through transistor 306 is then no longer zero after time t2, and is mirrored by current IBPR from current source 313 being conducted by transistor 308 rather than transistor 312. Transistors 314 and 316 in turn no longer conduct from supply terminal AVDLL, effectively turning off hysteresis current component IDHYST1 after time t2. Normal operation of comparator 100 then commences.

In this implementation, the amplitude of hysteresis current component IDHYST1 can be substantially larger than the static hysteresis current IHSTAT from static hysteresis current generator 160, considering that an actual transition of comparator 100 is not expected to occur during the current "deadzone" condition. Because dynamic hysteresis current generator 165 turns off hysteresis current component IDHYST1 at times outside of the "deadzone" interval, this additional dynamic hysteresis current IDHYST1 does not affect the performance of comparator 100. As a result, the stability of comparator 100 according to this example is improved over conventional comparator arrangements.

As noted in the Background, the TLV3604 high-speed comparator available from Texas Instruments Incorporated includes a circuit that applies a hysteresis current in response to the summed current from both transistors in the input pair being below a threshold level. It has been observed, in connection with the example embodiments described in this specification, that this prior approach generates this additional hysteresis current for only a portion of the "deadzone" condition, namely during the interval between times t0 and t1 in the example of FIG. 2A in which both currents Id1 and Id2 are substantially zero. Once currents Id1 and Id2 ramp up after time t1, as shown in FIG. 2A, the additional hysteresis current applied in this prior arrangement turns off. In contrast, the dynamic hysteresis current generator 165 according to the example embodiment of FIG. 3A can continue to dynamically apply its additional hysteresis current component over the full "deadzone" interval, providing further stability.

Referring back to FIG. 1A, comparator 100 according to this example includes capacitor 180P coupled between input INP and the gate of opposite input transistor 104N at node INNG, and capacitor 180N coupled between input INN and the gate of its opposite input transistor 104P at node INPG. These capacitors 180P, 180N are optional according to this example embodiment, but can provide additional stability as will now be described in connection with FIG. 2B.

Figure 2B:
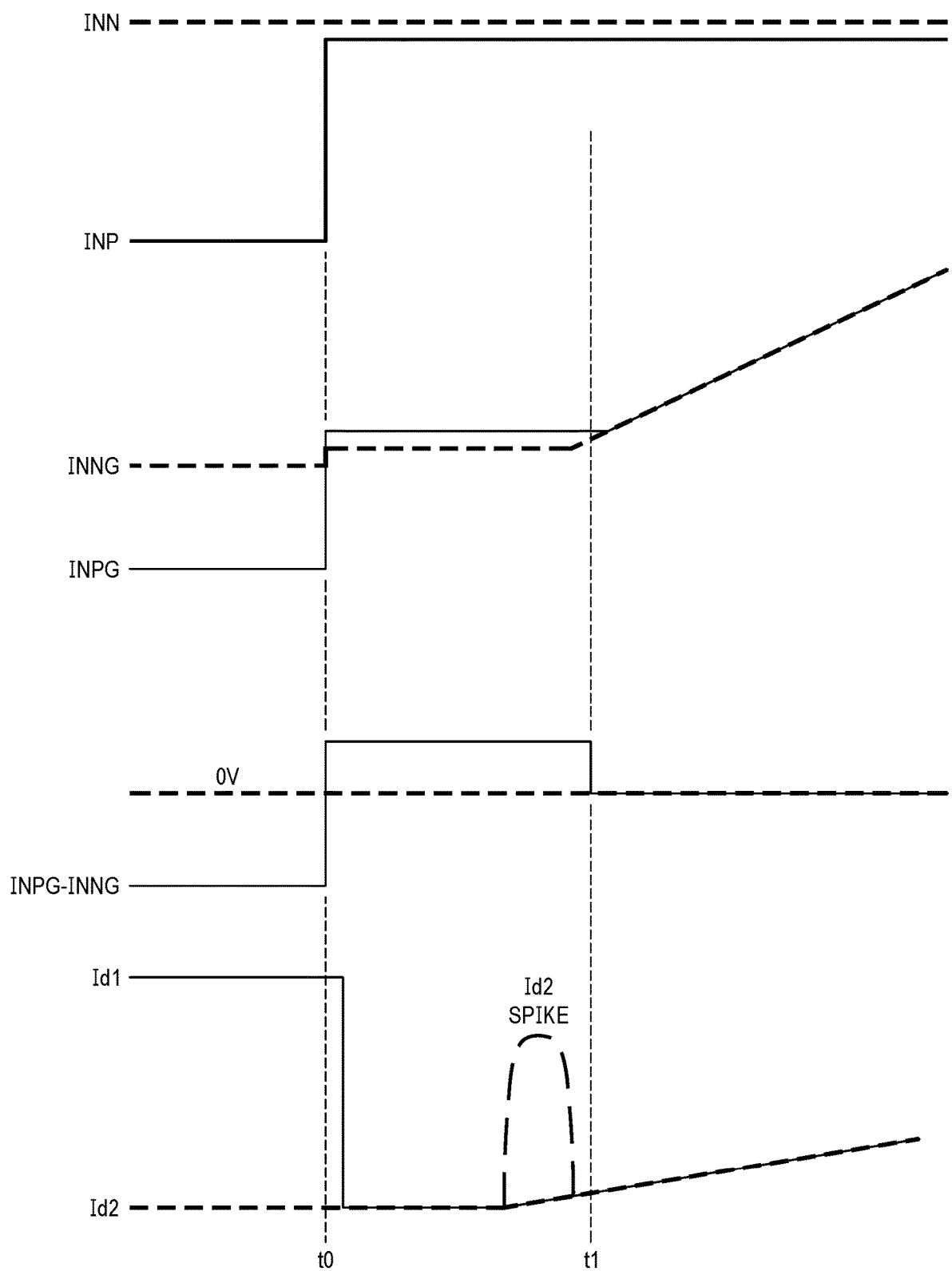
FIG. 2B is another timing diagram illustrating the operation of a conventional folded cascode comparator resulting in spurious output transitions.

FIG. 2B illustrates a potential instability in the operation of a comparator in which capacitors 180P, 180N are not included in its common source branch. This instability may occur during the "deadzone" in which the differential current Id1-Id2 from the common source branch is near zero.

The example of FIG. 2B is illustrated for the case of input INP receiving, at time t0, an abrupt transition from a low voltage (e.g., 0V) to a voltage (e.g., 9.9 V) slightly below the voltage at input INN, which remains at a high voltage (e.g., 10 V) This abrupt transition at input INP couples through high-voltage NMOS transistor 108P to node INPG at the gate of PMOS transistor 104P, as shown in FIG. 2B. While this transition at input INP also couples via parasitic capacitances to node INNG at the gate of NMOS transistor 104N, the increase in the voltage at node INNG due to this parasitic coupling is much smaller than that at node INPG.

It has been observed, in connection with the example embodiments described in this specification, that the voltage coupled to node INPG from the transition at input INP may raise its voltage above the voltage at node INNG, resulting in a positive polarity differential voltage INPG-INNG following the transition at time t0, as shown in FIG. 2B. This positive differential voltage INPG-INNG, over the interval between the transition at time t0 and the ramping of the voltages at nodes INPG, INNG beginning at time t1, can cause PMOS transistor 104N to briefly turn on, resulting in a spike of current Id2 from common source branch 102 to intermediate output line VXP. If this current spike is of sufficient amplitude and duration, it may cause an undesired and erroneous transition at the output of comparator 100.

Capacitors 180P, 180N in comparator 100 according to this example embodiment address this source of instability. In particular, capacitor 180P couples transitions at input INP to node INNG at the gate of transistor 104N, and capacitor 180N likewise couples transitions at input INN to node INPG at the gate of transistor 104P. By increasing the coupling between inputs INP, INN and the gates of the opposing input transistor 104N, 104P, respectively, capacitors 180P, 180N can eliminate the differential current spike caused by inversion of the differential voltage across nodes INPG, INNG.

Figure 3C:
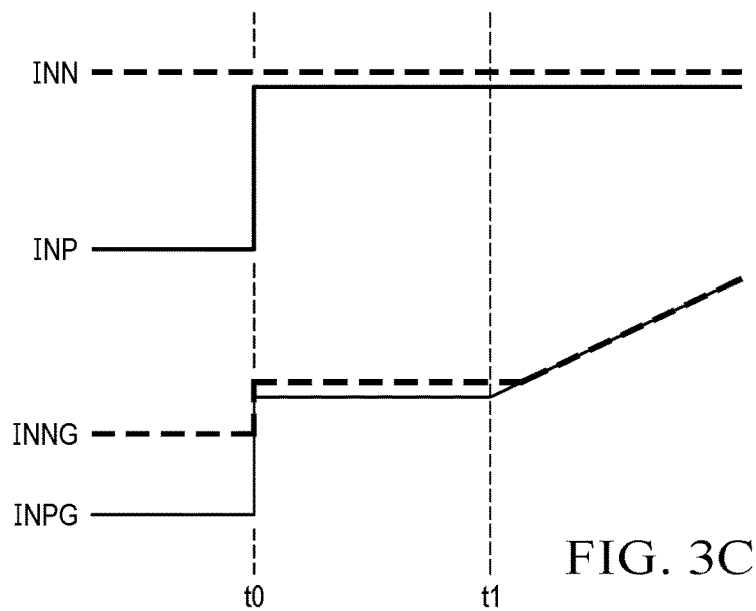
FIG. 3C is a timing diagram illustrating an example of the operation of the dynamic hysteresis current generator of FIG. 3A in the comparator circuit of FIG. 1A according to an example embodiment.

FIG. 3C illustrates an example the operation of comparator 100 according to this example embodiment in which capacitors 180P, 180N are provided as shown in FIG. 1A. In this example, an abrupt transition at input INP to a voltage slightly below the voltage at input INN is received by comparator 100 at time t0. As in the case of FIG. 2B, this transition at input INP couples through high-voltage NMOS transistor 108P to raise the voltage at gate node INPG. In this example, however, the transition at node INP at the same time couples via capacitor 180P to node INNG at the gate of PMOS transistor 104N. This additional coupling to node INNG maintains the voltage at that node above the voltage at gate node INPG, and thus avoids a change in the polarity of differential voltage INPG-INNG following the transition at time t0, in turn avoiding a spurious current spike from common source branch 102 that may cause an undesired output transition.

According to this example embodiment, therefore, the possibility of a spurious and erroneous transition at the output of comparator 100 can be avoided, even in high voltage implementations such as automotive system applications.

FIG. 1B illustrates that hysteresis current generator 132 according to this example implementation, may include dynamic hysteresis current generator 170 configured and operable to generate dynamic hysteresis current component IDHYST2. According to an example embodiment, dynamic hysteresis current generator 170 generates dynamic hysteresis current component IDHYST2 during certain operational events or conditions in which a spike in one of currents Id1, Id2 may occur. More particularly, dynamic hysteresis current generator 170 is constructed and operable to generate dynamic hysteresis current component IDHYST2 to protect against current spikes occurring as a result of the voltage at one of inputs INP, INN of comparator 100 according to FIG. 1A making a rapid transition from a high voltage to a low voltage.

FIG. 2A further illustrates an example of the operation of comparator 100 in which such a current spike can occur. In this example between time t2 and time t3, input INN is at a high voltage (e.g., 10 V) and input INP has been maintained at a voltage (e.g., 9.9 V) slightly below the voltage at input INN. During this interval, common source voltage VS1 has been at a relatively high voltage, such that PMOS transistors 104P, 104N conduct currents Id1, Id2 according to the differential voltage at inputs INP, INN. In this example in which input INN is only slightly higher than input INP, current Id1 conducted by PMOS transistor 104P is slightly larger than current Id2 conducted by PMOS transistor 104N, such that differential current Id1-Id2 is slightly positive. Intermediate output VO from common gate branch 110 is at a low logic level, consistent with this polarity in the differential voltage at inputs INP, INN.

At time t3 in this example, an abrupt transition to a low voltage (e.g., at or near 0 V) is received at input INP. Because the voltage at input INP prior to time t3 was lower than that at input INN, albeit only slightly, the output state of comparator 100 should not change as a result of this transition. In this arrangement, NMOS transistors 108P, 108N provide no loop operation for falling input voltages, common source voltage VS1 is rapidly pulled low as a result of the transition at input INP. This rapid transition of common source voltage VS1 causes a large current spike in both of currents Id1 and Id2, appearing both as a common-mode current spike and also as a spike in differential current Id1-Id2, as shown in FIG. 2A. Because common source branch 102 is operating as an amplifier under low bias current in this situation, this current spike can cause a spurious transition in the output stage, as shown in FIG. 2A by the incorrect high logic level output state ERROR at intermediate output VO.

Figure 4A:
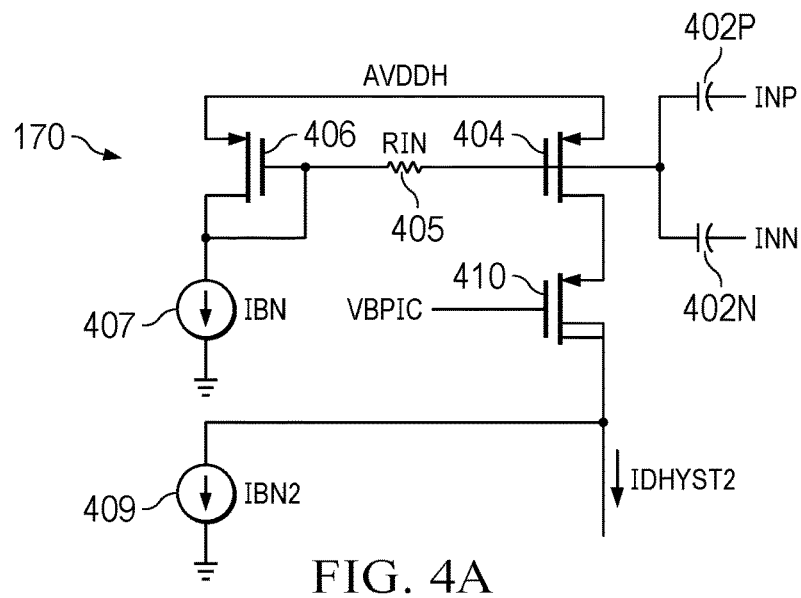
FIG. 4A is an electrical diagram, in schematic form, of a dynamic hysteresis current generator according to another example embodiment.

FIG. 4A illustrates the construction of an example of dynamic hysteresis current generator 170 configured and operable to prevent spurious output transitions in this current spike situation. As shown in FIG. 4A, dynamic hysteresis current generator 170 includes coupling capacitor 402P coupled between input INP and the gate of a PMOS transistor 404, and also includes coupling capacitor 402N coupled between input INN and the gate of PMOS transistor 404. The source of PMOS transistor 404 is coupled to supply terminal AVDDH. The gate of PMOS transistor 404 is also coupled through resistor 405 to the gate and drain of PMOS transistor 406, which has its source at supply terminal AVDDH and its drain coupled through current source 407 to the common terminal (e.g., circuit ground). Current source 407 is biased to conduct a current IBN. As such, transistors 404, 406 are arranged in a current mirror, with the current conducted by transistor 404 corresponding to the current conducted by transistor 406. The drain of transistor 404 is coupled to the source of high-voltage PMOS transistor 410, which receives a bias voltage VBPIC. The drain of transistor 410 is coupled to circuit ground via current source 409, which is biased to conduct a current IBN2. In this example, current IBN2 can be substantially equal to current IBN from current source 407. Dynamic hysteresis current component IDHYST2 is sourced from the drain of high-voltage transistor 410 to the extent that the current conducted by PMOS transistor 404 exceeds current IBN2 conducted by current source 409.

Figure 4B:
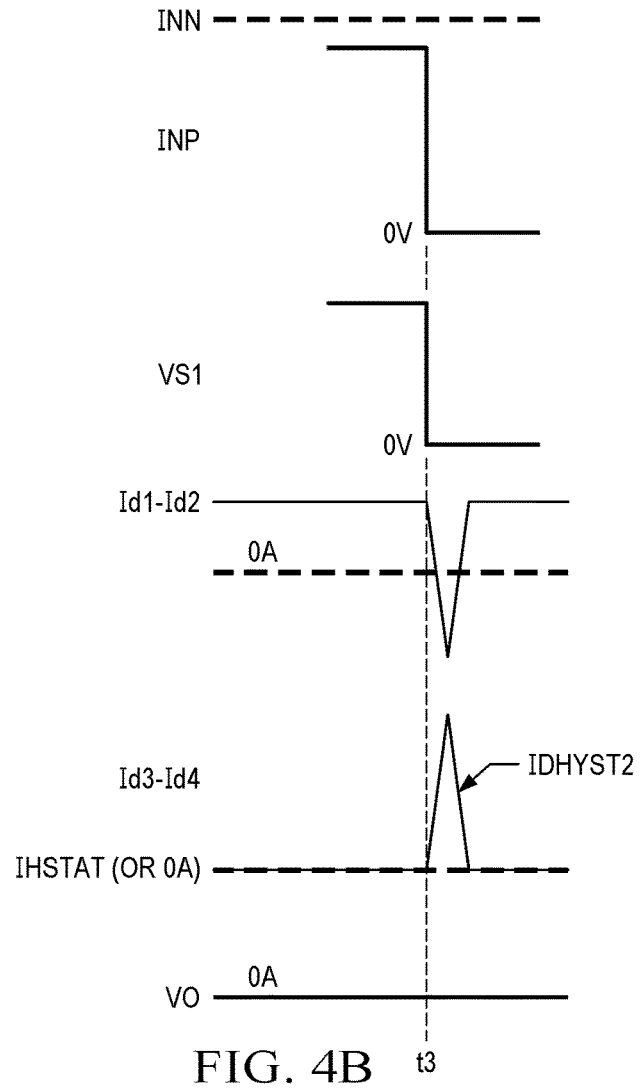
FIG. 4B is a timing diagram illustrating an example of the operation of the dynamic hysteresis current generator of FIG. 4A according to an example embodiment.

In operation, a high-to-low voltage transition at either of inputs INP, INN couples to the gate of PMOS transistor 404, and via resistor 405 to the gate of PMOS transistor 406. FIG. 4B illustrates an example of the operation of dynamic hysteresis current generator 170 in this event. Current IBN from current source 407 conducts through transistor 406, and current IBN2 is conducted by transistors 404 and 410 and current source 409. Transistors 404, 406, and 410 are thus in an on state prior to time t3. At time t3, input INP receives a high-to-low transition while input INN remains at a high voltage (e.g., 10 V). Energy from this transition capacitively couples as a pulse to the gates of transistors 404, 406, turning both devices strongly on for a time determined by the capacitance of capacitor 402P and the resistance of resistor 405. During this pulse, transistor 406 conducts a current much larger than current IBN, and transistor 404 correspondingly conducts a current much larger than current IBN2 of current source 409. The current in excess of current IBN2 that is conducted by transistor 404 is output from the drain of high-voltage transistor 410 as a pulse of dynamic hysteresis current component IDHYST2. Adder 175 adds this dynamic hysteresis current component IDHYST2 to static hysteresis current component IHSTAT (if any), and the summed current IHYST is conducted by one of transistors 134P, 134N in hysteresis branch 130 as current Id3 or Id4, depending on the current output state. In the example of FIG. 4B in which input INP receives the high-to-low transition at time t3, the pulse of hysteresis current component IDHYST2 appears as a positive polarity differential current pulse Id3-Id4 with an amplitude sufficient to counteract the negative polarity of the differential current Id1-Id2 at intermediate output lines VXP, VXN caused by the input transition.

The duration of the pulse of hysteresis current component IDHYST2 is determined by the capacitance of capacitors 402P, 402N in combination with the resistance of resistor 405. Upon the voltage at inputs INP, INN stabilizing (e.g., at some time after time t3), only a mirrored current equal to current IBN is conducted by transistor 404. Since this current IBN conducted by transistor 406 does not exceed current IBN2 conducted by current source 409 in this example, dynamic hysteresis current component IDHYST2 turns off. Depending on the values of capacitors 402P, 402N and resistor 405, the duration of the pulse of dynamic hysteresis current component IDHYST2 can be quite brief (e.g., shorter than 1 μs), since the spike in currents Id1, Id2 due to this input transition is generally quite short.

In this implementation, the amplitude of hysteresis current component IDHYST2 can be substantially larger than the static hysteresis current IHSTAT from static hysteresis current generator 160, considering that an actual transition of comparator 100 is not intended during this brief current spike event. The duration of hysteresis current component IDHYST2 generated by dynamic hysteresis current generator 170 can similarly be quite brief, such that hysteresis current component IDHYST2 can otherwise be at zero. Accordingly, even if the amplitude of dynamic hysteresis current IDHYST2 can be quite large, its short duration will not adversely affect the performance of comparator 100. As a result, the stability of comparator 100 according to this example is improved over conventional comparator arrangements.

According to these example embodiments, dynamic hysteresis is provided for comparator circuits to prevent spurious and erroneous output transitions that may be caused by transient events of various types at the comparator inputs. Examples of these transient events include a current "dead-zone" of zero differential current from the comparator input stage, and also a current spike event caused by an abrupt transition at an input. The dynamic nature of the hysteresis generation provided according to these example embodiments does not affect comparator performance outside of the transient events. Benefits of the example embodiments described herein are especially useful for comparators of the folded cascode type applied in high voltage environments, such as automotive system applications.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device, or other electronics or semiconductor component.

Unless otherwise stated, "about," "approximately," or "substantially" preceding a value means +/−10 percent of the stated value. Modifications are possible in the described examples, and other examples are possible within the scope of the claims.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party. While, in some example embodiments, certain elements are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuitboard.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description.

While one or more embodiments have been described in this specification, it is of course contemplated that modifications of, and alternatives to, these embodiments, such modifications and alternatives capable of obtaining one or more of the technical effects of these embodiments, will be apparent to those of ordinary skill in the art having reference to this specification and its drawings. It is contemplated that such modifications and alternatives are within the scope of the claims presented herein.

What is claimed is:

1. A comparator circuit, comprising:
  a common source branch comprising:
    first and second transistors having sources coupled in common to a supply terminal, the first transistor having a gate coupled to a first input of the comparator circuit, the second transistor having a gate coupled to a second input of the comparator circuit and a drain coupled to a first intermediate output, and the first transistor having a drain coupled to a second intermediate output;
  a common gate branch, comprising:
    third and fourth transistors having gates coupled in common to a first bias voltage, the third transistor having a source coupled to the first intermediate output and to a common terminal, and having a drain coupled to a third intermediate output, and the fourth transistor having a source coupled to the second intermediate output and the common terminal, and having a drain; and
    a bias circuit, coupled to the supply terminal and to the drain of the fourth transistor;
  a digital output circuit, having an input coupled to the third intermediate output, and configured to present complementary logic levels at first and second outputs responsive to a voltage at its input; and
  a hysteresis branch, comprising:
    a hysteresis current generator;
    a first hysteresis transistor having a source-drain path coupled between an output of the hysteresis current generator and the second intermediate output, and having a gate coupled to the first output of the digital output circuit;
    a second hysteresis transistor having a source-drain path coupled between the output of the hysteresis current generator and the first intermediate output, and having a gate coupled to the second output of the digital output circuit;
  wherein the hysteresis current generator comprises:
    first and second replica transistors having sources coupled in common to a first current source, and having drains coupled in common, the first replica transistor having a gate coupled to the first input, and the second replica transistor having a gate coupled to the second input;
    a hysteresis capacitor coupled between the sources of the first and second replica transistors and the common terminal; and
    a first current mirror having a first leg coupled to the drains of the first and second replica transistors, and having a second leg coupled to a second current source; and
    a second current mirror having a first leg coupled to the second current source, and having a second leg; and
    an output transistor coupled to the second leg of the second current mirror, and coupled to the source/drain paths of the first and second hysteresis transistors.

2. The comparator circuit of claim 1, wherein the first current mirror of the hysteresis current generator comprises:
  a first mirror transistor having a gate and a drain coupled to the drains of the first and second hysteresis transistors, and having a source at the common terminal;
  a second mirror transistor having a gate coupled to the gate and drain of the first mirror transistor, and having a source at the common terminal;
  wherein the second current mirror of the hysteresis current generator comprises:
    a third mirror transistor having a drain and a gate coupled to the third current source; and
    a fourth mirror transistor having a gate coupled to the gate and drain of the third mirror transistor, and having a source at the common terminal;
  and further comprising:

a fifth mirror transistor of opposite conductivity type to the fourth mirror transistor, the fifth mirror transistor having a drain and a gate coupled to a drain of the fourth mirror transistor and to a gate of the output transistor, and having a source coupled to the supply terminal.

3. The comparator circuit of claim 1, wherein the common source branch further comprises:
a first capacitor coupled between the first input and the gate of the second transistor; and
a second capacitor coupled between the second input and the gate of the first transistor.

4. The comparator circuit of claim 3, wherein the common source branch further comprises:
a first high-voltage transistor having a source/drain path coupled between the first input and the gate of the first transistor, and having a gate;
a second high-voltage transistor having a source/drain path coupled between the second input and the gate of the second transistor, and having a gate; and
a third current source, coupled between the supply terminal and the sources of the first and second transistors;
a fourth current source, coupled to the supply terminal; and
a bias transistor, having a source coupled to the fourth current source, a drain coupled to a common terminal, and a gate coupled to the drains of the first and second transistors;
wherein the gates of the first and second high-voltage transistors are coupled to the source of the bias transistor.

5. The comparator circuit of claim 1, wherein the common source branch further comprises:
a first high-voltage transistor having a source/drain path coupled between the first input and the gate of the first transistor, and having a gate;
a second high-voltage transistor having a source/drain path coupled between the second input and the gate of the second transistor, and having a gate; and
a fifth current source, coupled to the supply terminal; and
a bias transistor, having a source coupled to the fifth current source, a drain coupled to a common terminal, and a gate coupled to the drains of the first and second transistors;
wherein the gates of the first and second high-voltage transistors are coupled to the source of the bias transistor.

6. The comparator circuit of claim 5, wherein the common source branch further comprises:
a third high-voltage transistor having a source/drain path coupled between the drain of the first transistor and the second intermediate output, and having a gate;
a fourth high-voltage transistor having a source/drain path coupled between the drain of the second transistor and the first intermediate output, and having a gate; and
a bias circuit coupled between the sources of the first and second transistors and the common terminal, and having an output coupled to the gates of the third and fourth high-voltage transistors.

7. The comparator circuit of claim 6, wherein the supply terminal coupled to the sources of the first and second transistors of the common source branch is a first supply terminal configured to receive a first power supply voltage;
wherein the supply terminal coupled to the bias circuit of the common gate branch is a second supply terminal configured to receive a second power supply voltage;
and wherein the first power supply voltage is higher than the second power supply voltage.

8. The comparator circuit of claim 1, wherein the first and second transistors are metal-oxide-semiconductor (MOS) transistors of a first channel conductivity type;
and wherein the third and fourth transistors are MOS transistors of a second channel conductivity type.

9. The comparator circuit of claim 8, wherein the first channel conductivity type is p-channel and the second channel conductivity type is n-channel.

10. The comparator circuit of claim 1, wherein the hysteresis current generator is a first hysteresis current generator;
and wherein the hysteresis branch further comprises:
a static hysteresis current source having an output coupled to the source/drain paths of the first and second hysteresis transistors.

11. The comparator circuit of claim 1, wherein the hysteresis current generator is a first hysteresis current generator;
and wherein the hysteresis branch further comprises a second hysteresis current generator, comprising:
a first coupling capacitor coupled to the first input;
a second coupling capacitor coupled to the second input;
a third current mirror comprising:
a first leg including a first leg transistor having a source coupled to a supply terminal, a drain coupled to a current source, and a gate coupled to its drain;
a resistor coupled to the gate of the first leg transistor; and
a second leg including a second leg transistor having a source coupled to a supply terminal, a gate coupled to the first and second coupling capacitors and coupled through the resistor to the gate of the first leg transistor, and a drain coupled to the source/drain paths of the first and second hysteresis transistors.

12. A comparator circuit, comprising:
a common source branch comprising:
first and second transistors having sources coupled in common to a supply terminal, the first transistor having a gate coupled to a first input of the comparator circuit, the second transistor having a gate coupled to a second input of the comparator circuit and a drain coupled to a first intermediate output, and the first transistor having a drain coupled to a second intermediate output;
a common gate branch, comprising:
third and fourth transistors having gates coupled in common to a first bias voltage, the third transistor having a source coupled to the first intermediate output and to a common terminal, and having a drain coupled to a third intermediate output, and the fourth transistor having a source coupled to the second intermediate output and the common terminal, and having a drain; and
a bias circuit, coupled to the supply terminal and to the drain of the fourth transistor;
a digital output circuit, having an input coupled to the third intermediate output, and configured to present complementary logic levels at first and second outputs responsive to a voltage at its input; and
a hysteresis branch, comprising:
a hysteresis current generator;

a first hysteresis transistor having a source-drain path coupled between an output of the hysteresis current generator and the second intermediate output, and having a gate coupled to the first output of the digital output circuit;

a second hysteresis transistor having a source-drain path coupled between the output of the hysteresis current generator and the first intermediate output, and having a gate coupled to the second output of the digital output circuit;

wherein the hysteresis current generator comprises:
a first coupling capacitor coupled to the first input;
a second coupling capacitor coupled to the second input;
a current mirror comprising:
a first leg including a first leg transistor having a source coupled to a supply terminal, a drain coupled to a first current source, and a gate coupled to its drain;
a resistor coupled to the gate of the first leg transistor; and
a second leg including a second leg transistor having a source coupled to a supply terminal, a gate coupled to the first and second coupling capacitors and coupled through the resistor to the gate of the first leg transistor, and a drain coupled to the source/drain paths of the first and second hysteresis transistors.

13. The comparator circuit of claim 12, wherein the common source branch further comprises:
a first high-voltage transistor having a source/drain path coupled between the first input and the gate of the first transistor, and having a gate;
a second high-voltage transistor having a source/drain path coupled between the second input and the gate of the second transistor, and having a gate; and
a second current source, coupled between the supply terminal and the sources of the first and second transistors;
a third current source, coupled to the supply terminal; and
a bias transistor, having a source coupled to the third current source, a drain coupled to the common terminal, and a gate coupled to the drains of the first and second transistors;
wherein the gates of the first and second high-voltage transistors are coupled to the source of the bias transistor;
and wherein the common source branch further comprises:
a third high-voltage transistor having a source/drain path coupled between the drain of the first transistor and the second intermediate output, and having a gate;
a fourth high-voltage transistor having a source/drain path coupled between the drain of the second transistor and the first intermediate output, and having a gate; and
a bias circuit coupled between the sources of the first and second transistors and the common terminal, and having an output coupled to the gates of the third and fourth high-voltage transistors.

14. The comparator circuit of claim 13, wherein the supply terminal coupled to the sources of the first and second transistors of the common source branch is a first supply terminal configured to receive a first power supply voltage;
wherein the supply terminal coupled to the bias circuit of the common gate branch is a second supply terminal configured to receive a second power supply voltage;
and wherein the first power supply voltage is higher than the second power supply voltage.

15. The comparator circuit of claim 12, wherein the first and second transistors are metal-oxide-semiconductor (MOS) transistors of a first channel conductivity type;
and wherein the third and fourth transistors are MOS transistors of a second channel conductivity type.

16. The comparator circuit of claim 15, wherein the first channel conductivity type is p-channel and the second channel conductivity type is n-channel.

17. The comparator circuit of claim 12, wherein the hysteresis current generator is a first hysteresis current generator;
and wherein the hysteresis branch further comprises:
a static hysteresis current source having an output coupled to the source/drain paths of the first and second hysteresis transistors.

18. A comparator circuit, comprising:
a common source branch configured to conduct a differential current at first and second intermediate outputs responsive to a differential input at first and second inputs;
a common gate branch configured to generate a voltage at a third intermediate output responsive to the differential current at the first and second intermediate outputs;
a digital output circuit, having an input coupled to the third intermediate output, and configured to present complementary logic levels at first and second outputs responsive to a voltage at its input; and
a hysteresis branch, comprising:
a hysteresis current generator, comprising:
first and second replica transistors having source/drain paths coupled in parallel to a current source, the first replica transistor having a gate coupled to the first input, and the second replica transistor having a gate coupled to the second input; and
a hysteresis capacitor coupled between the sources of the first and second replica transistors and a common terminal; and
current mirror circuitry, coupled to the source/drain paths of the first and second replica transistors, and configured to supply a current at an output of the hysteresis current generator while the first and second replica transistors are substantially in an off state;
a first hysteresis transistor having a source-drain path coupled between the output of the hysteresis current generator and the second intermediate output, and having a gate coupled to the first output of the digital output circuit;
a second hysteresis transistor having a source-drain path coupled between the output of the hysteresis current generator and the first intermediate output, and having a gate coupled to the second output of the digital output circuit.

19. The comparator circuit of claim 18, wherein the common source branch comprises:
a first transistor having a source coupled to a supply terminal, a gate coupled to the first input, and a drain coupled to the second intermediate output;
a second transistor having a source coupled in common with the source of the first transistor to the supply terminal, having a gate coupled to the second input, and a drain coupled to the first intermediate output;
a first capacitor coupled between the first input and the gate of the second transistor; and a second capacitor coupled between the second input and the gate of the first transistor;

and wherein the first and second replica transistors are configured as replicas of the first and second transistors in the common source branch.

20. The comparator circuit of claim 18, wherein the hysteresis current generator is a first hysteresis current generator;

and wherein the hysteresis branch further comprises a second hysteresis current generator, comprising second current mirror circuitry, the second current mirror circuitry comprising:
- a first leg transistor having a source coupled to a supply terminal, a drain coupled to a current source, and a gate coupled to its drain;
- a resistor coupled to the gate of the first leg transistor and to the first and second inputs; and
- a second leg transistor having a source coupled to a supply terminal, a gate coupled to the first and second inputs, and a drain coupled to the source/drain paths of the first and second hysteresis transistors.

* * * * *